United States Patent
Yang

(10) Patent No.: US 7,227,269 B2
(45) Date of Patent: Jun. 5, 2007

(54) WIRING STRUCTURE FOR A PAD SECTION IN A SEMICONDUCTOR DEVICE

(75) Inventor: Dong Heon Yang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 87 days.

(21) Appl. No.: 11/131,099

(22) Filed: May 16, 2005

(65) Prior Publication Data
US 2006/0017178 A1    Jan. 26, 2006

(30) Foreign Application Priority Data
Jul. 23, 2004    (KR) ...................... 10-2004-0057679

(51) Int. Cl.
*H01L 21/469*    (2006.01)
(52) U.S. Cl. ...................................... 257/786
(58) Field of Classification Search ................ 257/758, 257/728, 778, 777, 786, 784, 734
See application file for complete search history.

(56) References Cited

U.S. PATENT DOCUMENTS
6,785,143 B2 *    8/2004    Nakaoka ...................... 361/728
* cited by examiner

*Primary Examiner*—Howard Weiss
*Assistant Examiner*—(Vikki) Hoa B. Trinh
(74) *Attorney, Agent, or Firm*—Ladas & Parry LLP

(57) ABSTRACT

The wiring structure of a pad section in a semiconductor device includes a row of pads and a plurality of first bias wirings provided at either side of the row of pads on a same plane. The first bias wirings carry electrical signals to the pads. A plurality of second bias wirings is formed below the layer having the first bias wirings and the pads. The second bias wirings include a set of wiring parts that run in the direction of the row of pads to overlap with adjacent pads in the layer above. The second bias wirings also include a set of wiring parts that run perpendicular to the direction of the first bias wirings and between two adjacent pads in the layer above.

11 Claims, 3 Drawing Sheets

WIRING STRUCTURE FOR A PAD SECTION IN A SEMICONDUCTOR DEVICE

BACKGROUND OF THE INVENTION

1. Field of the Invention

The present invention relates generally to a semiconductor device, and more particularly to a wiring structure for a pad section in a semiconductor device having bias wirings used as signal paths for a predetermined number of signals.

2. Description of the Prior Art

A pad section in a semiconductor memory device is an area in which a plurality bonding pads including the probe pads for conducting probe tests and wirings that connect, for example, at least the bonding pads to other destinations of the semiconductor memory device are located.

FIG. 1 shows a general layout of a conventional semiconductor memory device including memory array sections 1 and peripheral portions 2.

There are basically three conventional ways to align or arrange a pad section in a semiconductor memory device. A pad section may be aligned in a peripheral portion 2 (the normal type), or in a memory array section 1 (the LOC type), or in both the peripheral portion 2 and the memory array section 1 (the dual pad type).

FIG. 2 is a plan view showing a conventional pad section wiring structure in a semiconductor device, and FIG. 3 is a sectional view taken along the line A–B shown in FIG. 2.

As shown in FIGS. 2 and 3, the conventional pad section of the semiconductor device has the wiring structure that includes: a pad array having a plurality of pads 11 aligned in a row at or near the middle portion of the pad section; a plurality of first bias wirings 13 provided at both sides of the pad array of pads 11 arranged in a row and having different voltage levels; and a plurality of second bias wirings 15 that run perpendicular to the direction of the first bias wirings 13, but in a layer below the layer having the pads 11 and the first bias wirings 13. That is, the pads 11 and the first bias wirings 13 are formed on a common plane above the layer having the second bias wirings. The first and second bias wirings 13, 15 are used as paths for carrying signals to or from the predetermined sources and destinations in the semiconductor device. Referring to FIG. 2, the first bias wirings 13 include Va1, Vb1, Vc1, and Vx1, and the second bias wirings 15 include Vd and Ve.

A bias line 17 runs in parallel with the first bias wirings 11 on one outermost side of the first bias wirings 13 as shown in FIG. 2 and is electrically connected to the second bias wirings 15.

According to the conventional pad section wiring structure described above, each of the first bias wirings 13 (Va1, Vb1, Vc1, and Vx1) aligned at both sides of the pad array-are correspondingly connected to the pads 11 (although the electrical connections between the wirings 13 and the pads 11 are not shown in FIG. 2). This is the reason why the pads 11 and the first bias wirings 13 are generally patterned on a same plane.

In addition, the second bias wirings (Vd and Ve) 15 are patterned on a lower layer of the first bias wirings 13 and are aligned perpendicular to the direction of the first bias wirings 13.

The bias line 17 (Vz1) is formed in the same direction as the first bias wirings 13 on the lowermost layer as shown in FIG. 3.

As semiconductor devices are more highly integrated and equipped with multiple functions, not only the bias wiring structure is becoming more complicated, but also the number of the bias wirings in the semiconductor device is increased. However, the area in a semiconductor device in which to align a pad section to carry those bias wirings is limited.

One obvious method to solve the problem is to enlarge the chip size to accommodate all of the increased number of wirings, but this is not an acceptable solution since the increased chip size will likely cause the produced semiconductor device to be less commercially competitive. Another method to solve the problem is to reduce the width of each wiring and the interval between two adjacent wirings without increasing the chip size, but this will increase the resistance and capacitance of the wirings, thereby lowering the operational performance of the semiconductor device.

SUMMARY OF THE INVENTION

Accordingly, the present invention has been made to solve the above-mentioned problems occurring in the prior art, and an object of the present invention is to provide a wiring structure for a pad section of a semiconductor device, capable of stably aligning a plurality of wirings without increasing a chip size and without reducing a width of the wiring and an interval between wirings by installing the wirings in a cavity part of the pad section.

In order to accomplish the above object, according to a first aspect of the present invention, there is provided a wiring structure for a pad section of a semiconductor device, the wiring structure comprising: a plurality of pads aligned at a central portion of the semiconductor device; a plurality of first bias wirings provided at both ends of the pads while being aligned in a same plane with the pads and used as signal paths for a predetermined amount of signals; and a plurality of second bias wirings provided below the first bias wirings while vertically crossing the first bias wirings by passing through lower portions underneath the pads and used as signal paths for a predetermined amount of signals.

According to the preferred embodiment of the present invention, the pads include bonding pads and probe pads.

The first bias wirings include VDD, VSS, VDDQ, VSSQ, VDDL, VSDL and VREF.

The second bias wirings are aligned perpendicularly to the first bias wirings, except for a predetermined region, in which at least two adjacent pads are provided so that the second bias wirings are aligned in parallel to the first bias wirings while passing through lower portions underneath the adjacent pads.

The number and/or amount of signals applied to the first bias wirings may be identical to those of the signals applied to the second bias wirings.

According to a second aspect of the present invention, there is provided a wiring structure for a pad section of a semiconductor device, the wiring structure comprising: a plurality of pads aligned at a central portion of the semiconductor device; a plurality of first bias wirings provided at both ends of the pads while being aligned in a same plane with the pads and used as signal paths for a predetermined amount of signals; and a plurality of second bias wirings provided below the first bias wirings and the pads while vertically crossing the first bias wirings and used as signal paths for a predetermined amount of signals, wherein the second bias wirings are aligned in parallel to the first bias wirings in a predetermined region, in which at least two adjacent pads are provided, while passing through lower portions underneath the adjacent pads.

According to the preferred embodiment of the present invention, a bias line is aligned below the second bias wirings and connected with the second bias wirings.

The first bias wirings include VDD, VSS, VDDQ, VSSQ, VDDL, VSDL and VREF.

The amount of signals applied to the first bias wirings is identical to the amount of signals applied to the second bias wirings.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a wiring structure for a pad section of a semiconductor device according to an embodiment of the present invention will be described with reference to accompanying drawings.

The present invention provides a wiring structure capable of stably aligning a plurality of wirings without increasing the chip size; and without reducing the width of a wiring; and without reducing the interval between the wirings. This is achieved by installing a set of second bias wirings perpendicularly to a set of first bias wirings and also by installing the set of second bias wirings in parallel with the set of first bias wirings below the layer having the pads, as these and other novel features are described in more detail below.

Figure 1:
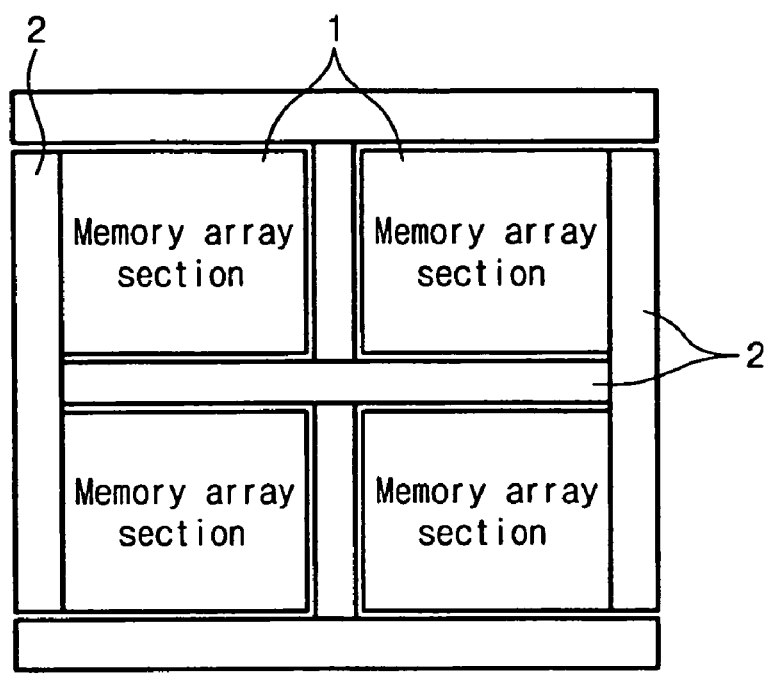
FIG. 1 is a plan view illustrating a conventional pad alignment region in a semiconductor device.
Figure 2:
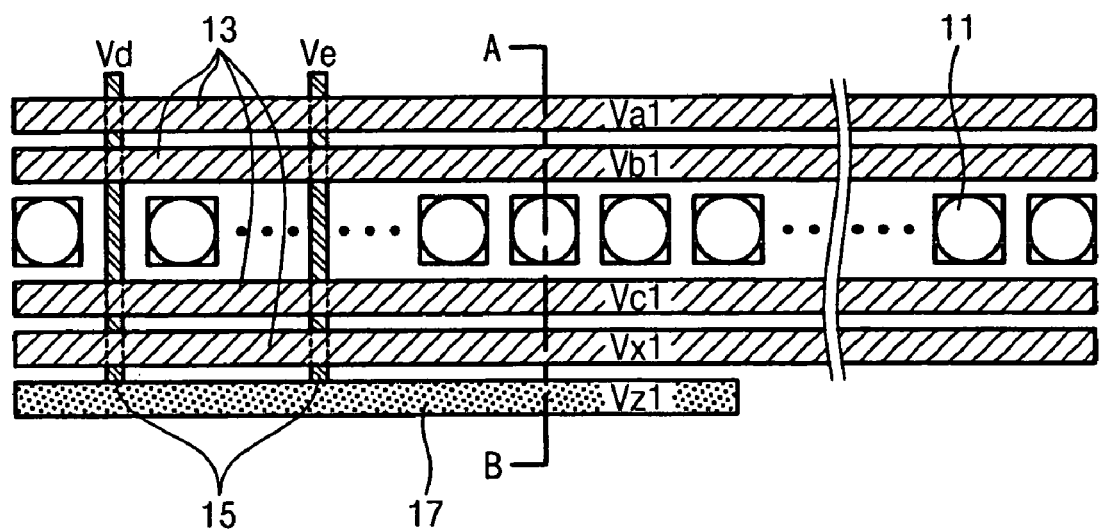
FIG. 2 is a plan view illustrating a conventional wiring structure for a pad section of a semiconductor device.
Figure 3:
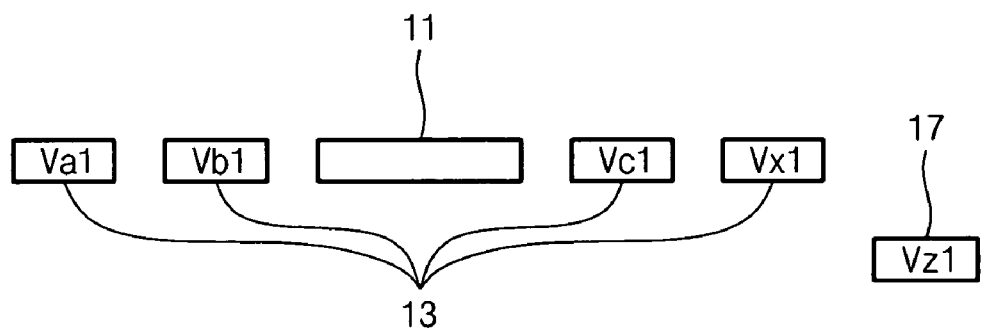
FIG. 3 is a sectional view taken along line A–B shown in FIG. 2.
Figure 4:
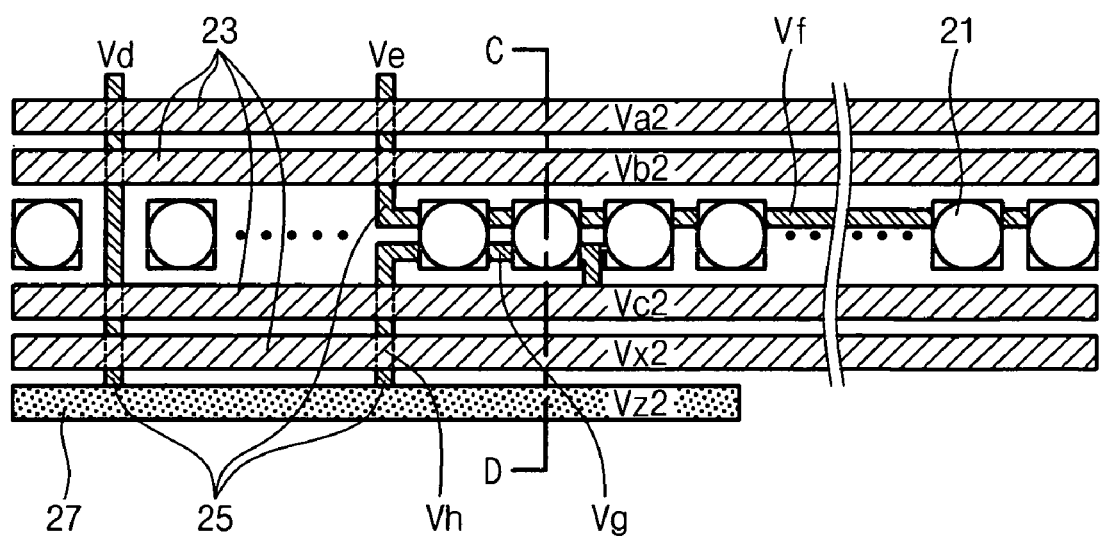
FIG. 4 is a plan view illustrating a pad section of a semiconductor device according to one embodiment of the present invention.
Figure 5:
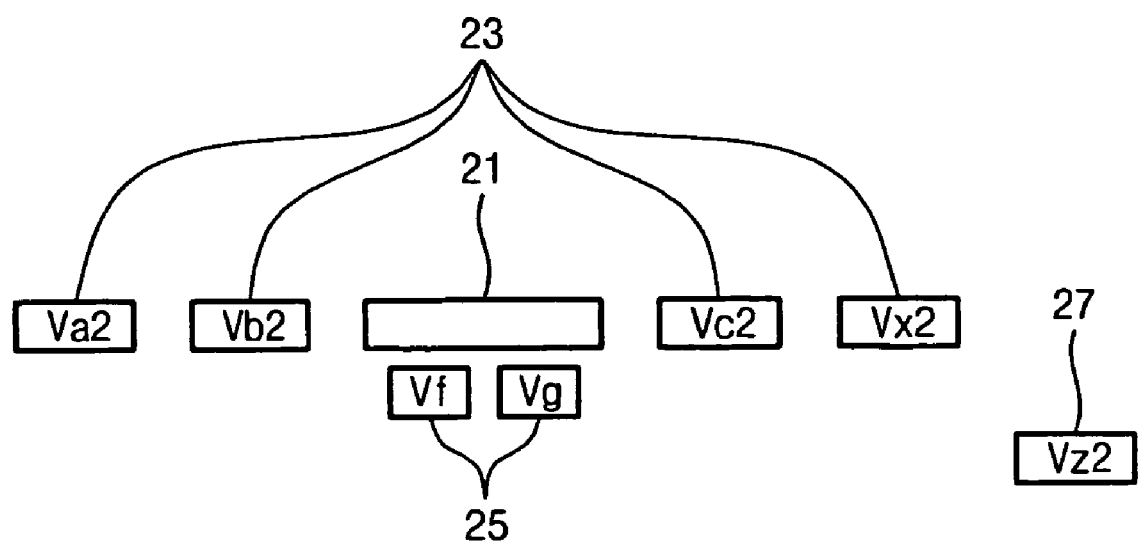
FIG. 5 is a sectional view taken along line C–D shown in FIG. 2.

FIG. 4 is a plan view illustrating a pad section of a semiconductor device according to one embodiment of the present invention, and FIG. 5 is a sectional view taken along the line C–D shown in FIG. 4.

As shown in FIGS. 4 and 5, the wiring structure of the pad section in the semiconductor device according to an embodiment of the present invention includes a pad array having a plurality of pads 21 arranged in a row and aligned at or near the middle portion of the pad section in the semiconductor device. A plurality of first bias wirings 23 is arranged in parallel with and on both sides of the row of pads 21. The first bias wirings 23 are used as signal paths for carrying a predetermined number of signals in the semiconductor device. A plurality of second bias wirings 25 are provided below layer having the first bias wirings 23 and arranged perpendicular to the direction of the first bias wirings 23 by passing through in a layer below the pads 21 and used as signal paths for carrying a predetermined number of signals.

The pads 21 include bonding pads and probe pads, among others. In addition, the same number of signals may be carried by the first and second bias wirings 23 and 25. However, it should recognized that the signals carried by the first and second wirings 23, 25 may be different according to the circuit design and the testing or other purposes.

The second bias wirings 25 including the wiring parts Vd, Ve, Vh as shown in FIG. 4 are provided below the layer having the first bias wirings 23 and the pads 21 and are aligned perpendicular to direction of the first bias wirings 23.

The wiring parts Vf and Vg of the second bias wirings 25 are branches of the parts Ve and Vh, respectively, and run in the middle part of the pad section in parallel with the first bias wirings 23 but below the layer having the pads 21. The wiring parts Vf and Vg of the second bias wirings 25 may overlap with at least two adjacent pads 21 that are in the layer above the second bias wirings 25.

Unlike the conventional wiring structure, the wiring structure according to the present invention provides the second bias wirings 25 (such as Vd, Ve, Vh as shown in FIG. 4) having the wiring parts Vf and Vg passing through at least two adjacent pads 21 below the layer having those adjacent pads 21.

In detail, the wiring parts Ve and Vh are patterned on a layer below the layer having the first bias wirings 23 and aligned perpendicular to direction of the first bias wirings 23. However, the wiring parts Vf and Vg are connected to Ve and Vh, respectively, causing the shape of each wiring part Ve, Vh to be bent as shown in FIG. 4, so that the second bias wiring parts Vf and Vg are aligned parallel to the first bias wirings 23 below the layer having the adjacent pads 21 in an overlapping manner with at least two adjacent pads 21.

The wiring part Vd of the second bias wirings 25 may extend perpendicular to the direction of the first bias wirings 23 below the layer having the bias wirings 23 between two locations of the pads 21 in a non-overlapping manner.

According to the pad section wiring structure of the semiconductor device having the above construction as shown in FIGS. 4 and 5, the first bias wirings 23 represented with a2, Vb2, Vc2, and Vx2 are aligned on both sides of the row of pads 21, and each of the first bias wirings 23 are electrically connected to the predetermined one or more of the pads 21 (although the electrical connection is not shown in FIG. 4) to facilitate the operation of the semiconductor device. In this case, the pads 21 and the first bias wirings 23 are patterned on the same layer.

Herein, the signals that are carried by the first bias wirings 23 to the pads 21 include VDD, VSS, VDDQ, VSSQ, VDDL, VSDL and VREF, among others.

In addition, a bias line 27 is formed in the lowermost layer that is even below the layer having the wiring parts Vf and Vg as shown in FIG. 5. The bias line 27 is biased through Vz2 and aligned in the same direction of the first bias wirings 23.

The wiring structure for the pad section according to the present invention is applicable for various wirings provided with predetermined power and used as signal paths for a predetermined number of signals. In addition, the wiring structure of the present invention can reduce the chip size by effectively utilizing the area below the pad array of the pad section for installing the wirings.

As described above, the wiring structure of the present invention can stably align a plurality of wirings without increasing a chip size and without reducing a width of the wiring and an interval between wirings by installing second bias wirings at a lower portion of a pad section.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A wiring structure of a pad section in a semiconductor device, the wiring structure comprising:
   a row of pads in a first substantially planar layer;
   a plurality of first bias wirings in the first substantially planar layer and aligned in a direction substantially parallel to the row of pads, the first bias wirings for carrying electrical signals, wherein the first bias wirings are formed along either side of the row of pads on the first substantially planar layer;
   and a plurality of second bias wirings in a second substantially planar layer, the second bias wirings for carrying electrical signals, wherein one part of each second bias wiring is aligned substantially perpendicular to the direction of the first bias wirings and another part of each second bias wiring is aligned substantially parallel to the direction of the first bias wirings, wherein at least one of the second bias wirings passing underneath at least one pad.

2. The wiring structure of claim 1, wherein the pads include at least bonding pads and probe pads.

3. The wiring structure of claim 1, wherein the electrical signals carried by the first bias wirings comprise VDD, VSS, VDDQ, VSSQ, VDDL VSDL and VREF.

4. The wiring structure of claim 1, wherein at least one of the second bias wirings is formed below the first substantially planar layer to run perpendicular to the direction of the first bias wirings in the first substantially planar layer without being underneath a pad in the first substantially planar layer.

5. The wiring structure of claim 1, wherein at least two pads in the first substantially planar layer overlap at least one of the second bias wirings.

6. The wiring structure of claim 1, wherein at least one of the first bias wirings carries electrical signal to one of the pads.

7. The wiring structure of claim 4, wherein same number of signals is carried by the first bias wirings and the second bias wirings.

8. The wiring structure of claim 1, wherein same number of signals is carried by the first bias wirings and the second bias wirings.

9. The wiring structure of claim 1 further comprising a bias line in the third substantially planar layer.

10. The wiring structure of claim 9 wherein the third substantially planar layer is below the second substantially planar layer.

11. The wiring structure of claim 9 wherein the bias line is aligned in a direction substantially in parallel to the direction of the first bias wirings.

* * * * *